(12) United States Patent
Herner

(10) Patent No.: US 8,362,356 B2
(45) Date of Patent: Jan. 29, 2013

(54) INTERMETAL STACK FOR USE IN A PHOTOVOLTAIC DEVICE

(75) Inventor: S. Brad Herner, Santa Clara, CA (US)

(73) Assignee: GTAT Corporation, Nashua, NH (US)

( * ) Notice: Subject to any disclaimer, the term of this patent is extended or adjusted under 35 U.S.C. 154(b) by 658 days.

(21) Appl. No.: 12/540,463

(22) Filed: Aug. 13, 2009

(65) Prior Publication Data

US 2011/0036397 A1 Feb. 17, 2011

(51) Int. Cl.
*H01L 31/00* (2006.01)
*H01L 31/18* (2006.01)

(52) U.S. Cl. ........ 136/256; 136/252; 136/260; 136/261; 257/E21.158; 257/E21.211

(58) Field of Classification Search .................. 136/156, 136/252, 256, 260, 261; 257/E21.158, E21.211
See application file for complete search history.

(56) References Cited

U.S. PATENT DOCUMENTS

| | | | | |
|---|---|---|---|---|
| 6,743,524 | B2 * | 6/2004 | Schaepkens ............... | 428/689 |
| 2002/0134425 | A1 * | 9/2002 | Yamamoto et al. .......... | 136/255 |
| 2006/0219293 | A1 * | 10/2006 | Morooka et al. ............. | 136/258 |
| 2007/0277874 | A1 | 12/2007 | Dawson-Elli et al. | |
| 2008/0070340 | A1 | 3/2008 | Borrelli et al. | |

OTHER PUBLICATIONS

Von Seefeld et al., "Titanium Nitride Layers for Solar Cell Contacts", IEEE, 1980.*
H.C. Kim, T.L. Alford, and D.R. Allee, "Thickness dependence on the thermal stability of silver thin films," App. Phys. Lett. 81,4287 (2002).
Bhagat, H. Han, and T.L. Alford, "Tungsten-titanium barriers for silver metallization," Thin Solid Films 515, 1998 (2002).
D.C. Thompson, T.L. Alford, J.W. Mayer, T. Hochbauer, M. Nastasi, S.S. Lau, N. David Theodore, K. Henttinen, Ilkka Suni, and P.K. Chu, "Microwave-cut silicon layer transfer," Appl. Phys. Lett. 87, 224103 (2005).
U.S. Appl. No. 12/026,530, filed Feb. 5, 2008, entitled "Method to Form a Photovoltaic Cell Comprising a Thin Lamina".
U.S. Appl. No. 12/484,271, filed Jun. 15, 2009, entitled "Selective Etch for Damage Removal at Exfoliated Surface".

* cited by examiner

*Primary Examiner* — Jennifer Michener
*Assistant Examiner* — Matthew Martin
(74) *Attorney, Agent, or Firm* — The Mueller Law Office, P.C.

(57) ABSTRACT

A donor silicon wafer may be bonded to a substrate and a lamina cleaved from the donor wafer. A photovoltaic cell may be formed from the lamina bonded to the substrate. An intermetal stack is described that is optimized for use in such a cell. The intermetal stack may include a titanium layer in contact with the lamina, which reacts to form titanium silicide, a non-reactive barrier layer to check the silicide reaction, a low-resistance layer, and an adhesion layer to help adhesion to the receiver element.

20 Claims, 6 Drawing Sheets

Embodiment of 12/026530

Embodiment of 12/026530

Embodiment of 12/026530

Embodiment of 12/026530

Embodiment of 12/026530

Embodiment of 12/026530

INTERMETAL STACK FOR USE IN A PHOTOVOLTAIC DEVICE

BACKGROUND OF THE INVENTION

The invention relates to an intermetal stack for use in a semiconductor device such as a photovoltaic cell.

In a conventional photovoltaic cell, a metal layer or stack at the back of the cell provides for electrical connection to the cell, and also provides a reflective layer, reflecting light back into the cell, allowing additional light to be absorbed. Some fabrication methods put constraints on the composition of this metal layer or stack.

There is a need, therefore, to optimize the intermetal stack for a photovoltaic cell.

SUMMARY OF THE PREFERRED EMBODIMENTS

The present invention is defined by the following claims, and nothing in this section should be taken as a limitation on those claims. In general, the invention is directed to an intermetal stack for use in a photovoltaic cell.

A first aspect of the invention provides for a photovoltaic assembly comprising: a silicon lamina; a receiver element; a low-resistance layer disposed between the lamina and the receiver element, wherein the low-resistance layer is silver, cobalt, tungsten, or an alloy thereof, a contact layer disposed between the low-resistance layer and the lamina, wherein the contact layer is either a) substantially titanium silicide or b) substantially titanium in unreacted regions and substantially titanium silicide in reacted regions; a non-reactive barrier layer disposed between the low-resistance layer and the contact layer; and a photovoltaic cell, wherein the photovoltaic cell comprises the lamina.

An embodiment of the invention provides for a photovoltaic assembly comprising: a semiconductor lamina; a contact layer of titanium silicide, or including regions of titanium silicide, wherein the titanium silicide of the contact layer is in immediate contact with the semiconductor lamina; a non-reactive barrier layer in immediate contact with the contact layer; a low-resistance layer, the non-reactive barrier layer disposed between the low-resistance layer and the contact layer, the low-resistance layer comprising silver, cobalt, or tungsten or alloys thereof, a receiver element; an adhesion layer, the adhesion layer in immediate contact with the receiver element and disposed between the receiver element and the low-resistance layer; and a photovoltaic cell, wherein the photovoltaic cell comprises the lamina.

Another aspect of the invention provides for a method to form a photovoltaic assembly, the method comprising: forming a contact layer, wherein the contact layer is titanium or a titanium alloy, wherein at least regions of the contact layer are in immediate contact with a silicon surface; forming a non-reactive barrier layer on and in immediate contact with the contact layer; forming a low-resistance layer on the non-reactive barrier layer, the low-resistance layer comprising silver, tungsten, cobalt, or alloys thereof, forming an adhesion layer on the low-resistance layer; bonding the silicon surface to a receiver element, the contact layer, non-reactive barrier layer, low-resistance layer and adhesion layer disposed between them; and forming a photovoltaic cell, the photovoltaic cell comprising the silicon surface, wherein the photovoltaic assembly comprises the photovoltaic cell and the receiver element.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
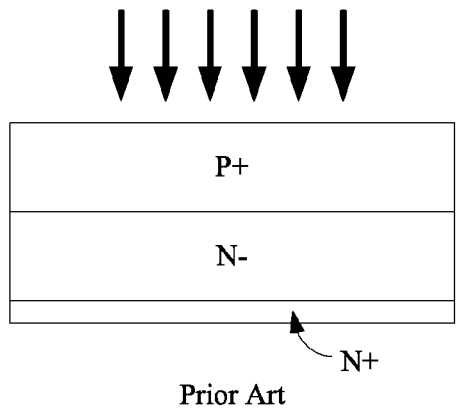
FIG. 1 is a cross-sectional drawing of a prior art photovoltaic cell.

A conventional prior art photovoltaic cell includes a p-n diode; an example is shown in FIG. 1. A depletion zone forms at the p-n junction, creating an electric field. Incident photons (incident light is indicated by arrows) will knock electrons from the valence band to the conduction band, creating free electron-hole pairs. Within the electric field at the p-n junction, electrons tend to migrate toward the n region of the diode, while holes migrate toward the p region, resulting in current, called photocurrent. Typically the dopant concentration of one region will be higher than that of the other, so the junction is either a p+/n− junction (as shown in FIG. 1) or a n+/p− junction. The more lightly doped region is known as the base of the photovoltaic cell, while the more heavily doped region is known as the emitter. Most carriers are generated within the base, and it is typically the thickest portion of the cell. The base and emitter together form the active region of the cell. The cell also frequently includes a heavily doped contact region in electrical contact with the base, and of the same conductivity type, to improve current flow. In the example shown in FIG. 1, the heavily doped contact region is n-type.

Figure 2A:
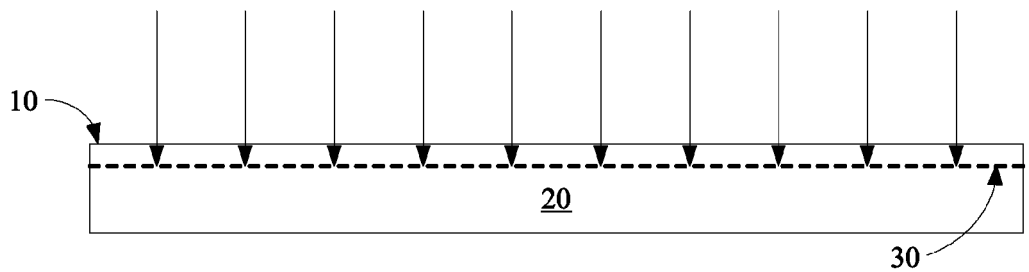
FIGS. 2a-2d are cross-sectional drawings of stages of fabrication of a photovoltaic cell formed according to an embodiment of U.S. patent application Ser. No. 12/026,530.
Figure 2B:
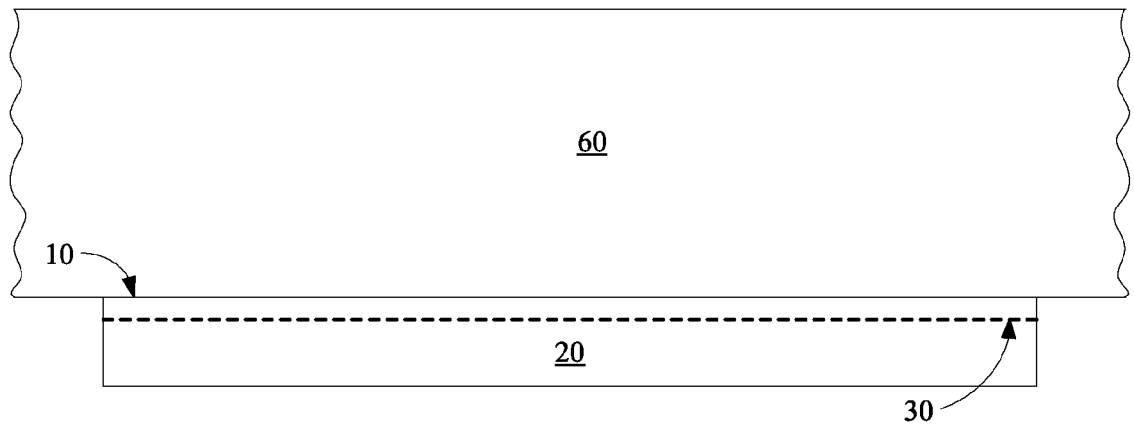
Figure 2C:
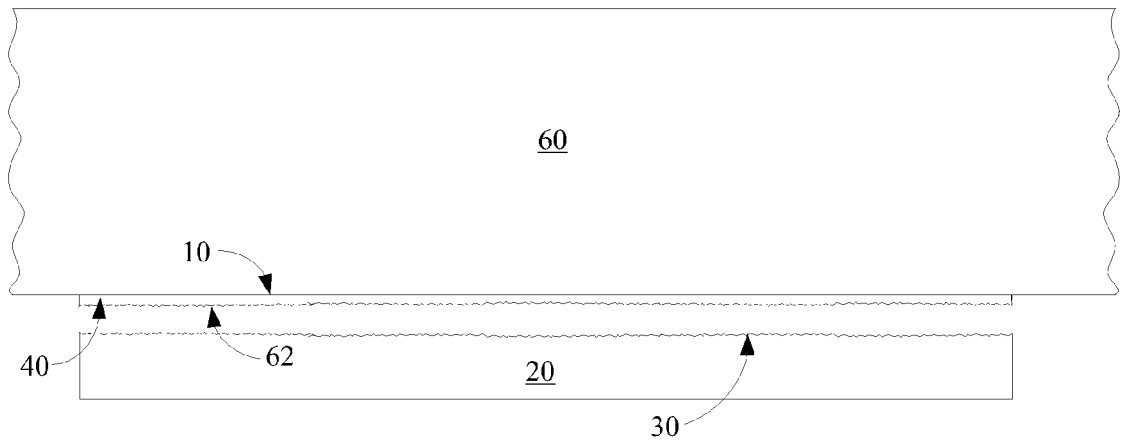
Figure 2D:
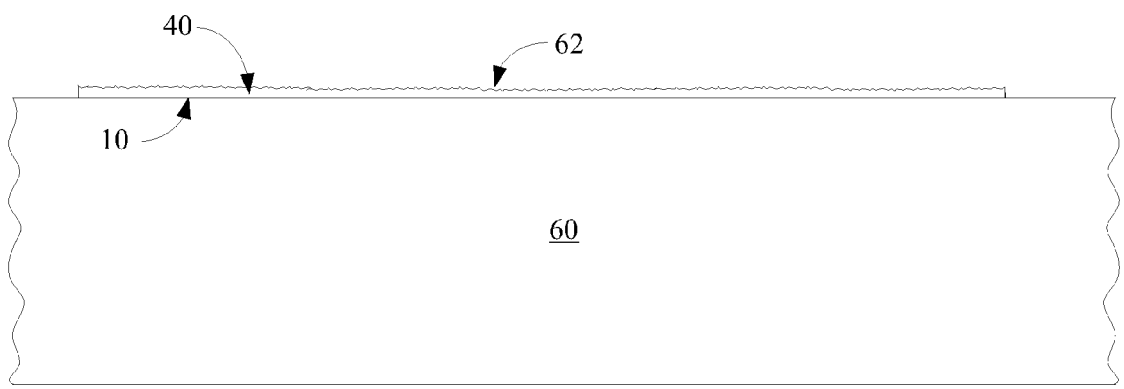

Sivaram et al., U.S. patent application Ser. No. 12/026,530, "Method to Form a Photovoltaic Cell Comprising a Thin Lamina," filed Feb. 5, 2008, owned by the assignee of the present invention and hereby incorporated by reference, describes fabrication of a photovoltaic cell comprising a thin semiconductor lamina formed of non-deposited semiconductor material. Referring to FIG. 2a, in embodiments of Sivaram et al., a semiconductor donor wafer 20 is implanted through first surface 10 with one or more species of gas ions, for example hydrogen and/or helium ions. The implanted ions define a cleave plane 30 within the semiconductor donor wafer. As shown in FIG. 2b, donor wafer 20 is affixed at first surface 10 to receiver 60. Referring to FIG. 2c, an anneal causes lamina 40 to cleave from donor wafer 20 at cleave plane 30, creating second surface 62. In embodiments of Sivaram et al., additional processing before and after the cleaving step forms a photovoltaic cell comprising semiconductor lamina 40, which is between about 0.2 and about 100 microns thick, for example between about 0.2 and about 50 microns, for example between about 1 and about 20 microns thick, in some embodiments between about 1 and about 10 microns thick, though any thickness within the named range is possible. FIG. 2d shows the structure inverted, with receiver 60 at the bottom, as during operation in some embodiments. Receiver 60 may be a discrete receiver element having a maximum width no more than 50 percent greater than that of donor wafer 10, and preferably about the same width, as described in Herner, U.S. patent application Ser. No. 12/057,265, "Method to Form a Photovoltaic Cell Comprising a Thin Lamina Bonded to a Discrete Receiver Element," filed on Mar. 27, 2008, owned by the assignee of the present application and hereby incorporated by reference. Alternatively, a plurality of donor wafers may be affixed to a single, larger receiver, and a lamina cleaved from each donor wafer.

In some embodiments the lamina or laminae may be annealed after cleaving to repair damage caused to the silicon by the implant. In this case the receiver element and all other materials present in the structure at this stage must be selected to tolerate the anneal temperature.

Using the methods of Sivaram et al., photovoltaic cells, rather than being formed from sliced wafers, are formed of thin semiconductor laminae without wasting silicon through excessive kerf loss or by fabrication of an unnecessarily thick cell, thus reducing cost. The same donor wafer can be reused to form multiple laminae, further reducing cost, and may be resold after exfoliation of multiple laminae for some other use.

Referring to FIG. 2d, in a photovoltaic cell formed using methods like those described in Sivaram et al., in which light falls initially on the photovoltaic cell including silicon lamina 40, and the receiver element 60 serves as the substrate, a metal layer or stack is typically formed at the back of the photovoltaic cell, interposed between lamina 40 and receiver element 60. The method of fabrication and the configuration of the device impose a variety of requirements on this metal layer or stack. A single material is unlikely to satisfy all these requirements.

Figure 3A:
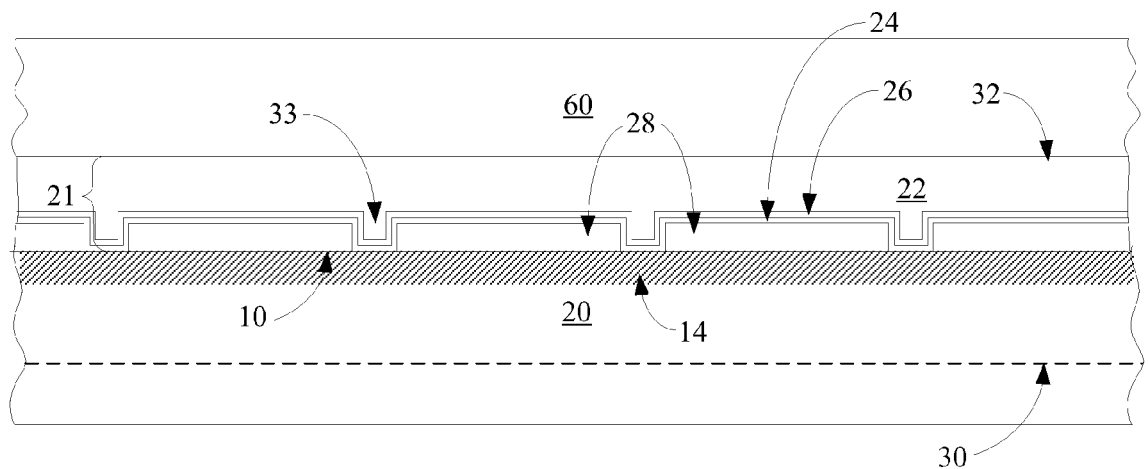
FIGS. 3a and 3b are cross-sectional drawings of photovoltaic cells including a semiconductor lamina and an intermetal stack formed according to embodiments of the present invention.

In the present invention, an intermetal stack has been optimized to accommodate the competing requirements of this structure and the method of forming it. As will be seen, the stack of the present invention allows for good ohmic contact to the lamina, good adhesion to both the lamina and the receiver element, low resistance, good reflectivity, and tolerance of high temperature. FIG. 3a shows the structure during fabrication. Donor wafer 20 has been previously implanted, as described earlier, to define cleave plane 30. Donor wafer 20 is affixed to receiver element 60 with the intermetal stack 21 disposed between them. Included in intermetal stack 21 is layer 22, which is a low-resistivity material that can tolerate high temperature. This layer may be silver, tungsten, cobalt, or an alloy thereof, for example it may be an alloy that is at least 90 atomic percent silver, cobalt, or tungsten.

If, for example, silver is in direct contact with silicon during a high-temperature step, however, some silver may diffuse into the silicon, reducing conversion efficiency and/or decreasing adhesion. In the present invention, electrical contact to silicon is made with a layer 24 of titanium. In the example shown in FIG. 3a, a dielectric layer 28 is formed in immediate contact with donor wafer 20. Holes or vias 33 are formed through dielectric layer 28, exposing silicon at first surface 10 of donor wafer 20 in the vias. Titanium layer 24 is formed on dielectric layer 28, and contacts donor wafer 20 where it is exposed in vias 33. In an alternative embodiment, shown in FIG. 3b, the entire titanium layer 24 is in immediate contact with donor wafer 20, with no intervening dielectric. Titanium readily tolerates high temperature, and adheres well to both silicon and many dielectric materials that can be used for dielectric layer 28, such as silicon dioxide and silicon nitride. During typical anneal temperatures, titanium in immediate contact with silicon will react to form titanium silicide. Titanium silicide provides an excellent ohmic contact to the cell to be formed.

Figure 3B:
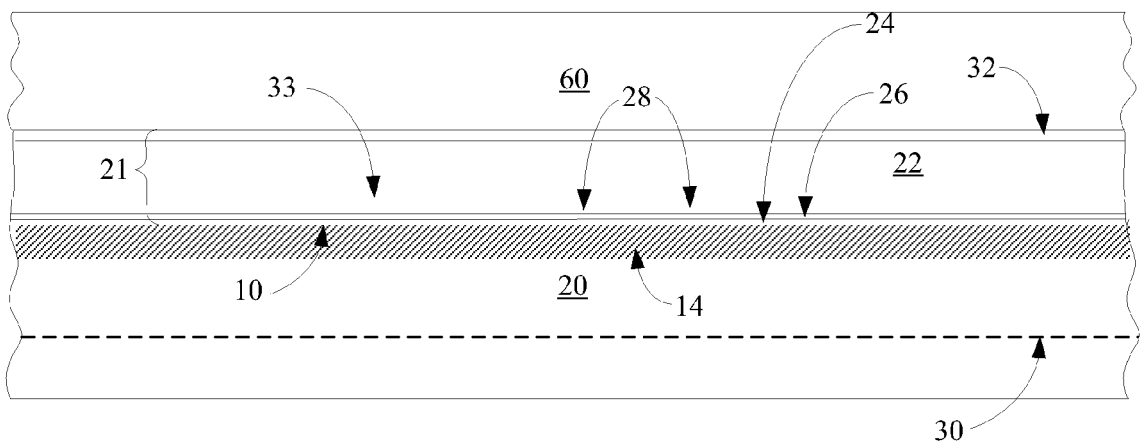

Titanium and titanium silicide, however, do not provide an adequate barrier to prevent silver from diffusing into silicon during anneal. Further, during anneal, the silicide reaction may consume too much silicon if too much titanium is present. Referring to FIGS. 3a and 3b, region 14 of donor wafer 20 in immediate contact with intermetal stack 21 is typically heavily doped; this heavily doped region 14 either may form the junction of the cell, or may provide good ohmic contact to the base region of the cell. If too much silicide is formed, most or all of heavily doped region 14 may be consumed, damaging cell performance.

To provide a barrier to unwanted diffusion of silver and to stop the silicide reaction, a non-reactive, conductive barrier layer 26 intervenes between titanium layer 24 and low-resistance layer 22. Layer 26 will not react with silicon; thus the silicide reaction will stop when all of the titanium of layer 24 has been consumed. The material of layer 26 is also selected to be an effective diffusion barrier to the low-resistance material of layer 22, such as silver. Non-reactive barrier layer 26 may be, for example, TiW, TiN, W, Ta, TaN, TaSiN, Ni, Mo, Zr, or an alloy thereof. Non-reactive barrier layer 26 will be in immediate contact with titanium layer 24. In some embodiments, non-reactive barrier layer may include two or more layers of suitable materials.

Intermetal stack 21 must adhere not only to donor wafer 20, but also to receiver element 60. Receiver element 60 may be any suitable material, for example glass, semiconductor, metal, ceramic, or polymer. Receiver element 60 may also be a laminate, where the surface facing the intermetal stack is one of these materials. Silver, cobalt, tungsten, or their alloys may not adhere well to such a receiver element 60. In some embodiments, an adhesion layer 32 is included between low-resistance layer 22 and receiver element 60, and will be in immediate contact with receiver element 60. Adhesion layer 32 may be, for example, titanium or any other suitable material, and will be in immediate contact with the surface of receiver element 60.

In some embodiments, additional layers may intervene in the stack, for example between low-resistance layer 22 and non-reactive barrier layer 26, or between low-resistance layer 22 and adhesion layer 32; while in other embodiments intermetal stack 21 will consist solely of titanium layer 24, non-reactive barrier layer 26, low-resistance layer 22, and adhesion layer 32 with no intervening layers. Note that generally some process step, for example exfoliation or a damage anneal, will be performed at a process temperature that will cause titanium of layer 24 in contact with donor wafer 20 to form titanium silicide. In a cell derived from a structure like that shown in FIG. 3b, in which all of titanium layer 24 is in contact with donor wafer 20, in the finished device, all of layer 24 will be converted to titanium silicide. In a cell derived from a structure like that shown in FIG. 3a, in which titanium layer 24 contacts donor wafer 20 only in vias 33 formed through dielectric layer 28, in the finished device, layer 24 will be titanium in unreacted regions and titanium silicide in reacted regions, the reacted regions forming where the titanium actually contacts the silicon.

Both FIGS. 3a and 3b show a photovoltaic assembly comprising: a silicon lamina; a receiver element; a low-resistance layer disposed between the lamina and the receiver element, wherein the low-resistance layer is silver, cobalt, tungsten, or an alloy thereof, a contact layer disposed between the low-resistance layer and the lamina, wherein the contact layer is either a) substantially titanium silicide or b) substantially titanium in unreacted regions and substantially titanium silicide in reacted regions; a non-reactive barrier layer disposed between the low-resistance layer and the contact layer; and a photovoltaic cell, wherein the photovoltaic cell comprises the lamina. In FIG. 3a a dielectric material intervenes between the lamina and the unreacted regions of the contact layer.

In general, such a photovoltaic assembly can be created by a method comprising: defining a cleave plane within a silicon donor wafer; forming a contact layer on the donor wafer, wherein the contact layer is titanium or a titanium alloy, wherein at least regions of the contact layer are in immediate contact with a first surface of the donor wafer; forming a non-reactive barrier layer on and in immediate contact with the contact layer; after the step of forming the non-reactive barrier layer, forming a low-resistance layer on the donor wafer, the low-resistance layer comprising silver, tungsten, cobalt, or alloys thereof, after the step of forming the low-resistance layer, forming an adhesion layer on the donor wafer; bonding the donor wafer to a receiver element, the contact layer, non-reactive barrier layer, low-resistance layer and adhesion layer disposed between them; cleaving a silicon lamina from the donor wafer at the cleave plane, the lamina remaining bonded to the receiver element; and fabricating a photovoltaic cell, wherein the photovoltaic cell comprises the lamina.

For clarity, a detailed example of a photovoltaic assembly including a receiver element and a lamina having thickness between 0.2 and 100 microns, including an intermetal stack formed according to embodiments of the present invention, will be provided. For completeness, many materials, conditions, and steps will be described. It will be understood, however, that many of these details can be modified, augmented, or omitted while the results fall within the scope of the invention.

EXAMPLE

The process begins with a donor body of an appropriate semiconductor material. An appropriate donor body may be a monocrystalline silicon wafer of any practical thickness, for example from about 200 to about 1000 microns thick. In alternative embodiments, the donor wafer may be thicker; maximum thickness is limited only by practicalities of wafer handling. Alternatively, polycrystalline or multicrystalline silicon may be used, as may microcrystalline silicon, or wafers or ingots of other semiconductor materials, including germanium, silicon germanium, or III-V or II-VI semiconductor compounds such as GaAs, InP, etc., may be used. In this context the term multicrystalline typically refers to semiconductor material having grains that are on the order of a millimeter or larger in size, while polycrystalline semiconductor material has smaller grains, on the order of a thousand angstroms. The grains of microcrystalline semiconductor material are very small, for example 100 angstroms or so. Microcrystalline silicon, for example, may be fully crystalline or may include these microcrystals in an amorphous matrix. Multicrystalline or polycrystalline semiconductors are understood to be completely or substantially crystalline. It will be appreciated by those skilled in the art that the term "monocrystalline silicon" as it is customarily used will not exclude silicon with occasional flaws or impurities such as conductivity-enhancing dopants.

The process of forming monocrystalline silicon generally results in circular wafers, but the donor body can have other shapes as well. For photovoltaic applications, cylindrical monocrystalline ingots are often machined to an octagonal cross section prior to cutting wafers. Wafers may also be other shapes, such as square. Square wafers have the advantage that, unlike circular or hexagonal wafers, they can be aligned edge-to-edge on a photovoltaic module with minimal unused gaps between them. The diameter or width of the wafer may be any standard or custom size. For simplicity this discussion will describe the use of a monocrystalline silicon wafer as the semiconductor donor body, but it will be understood that donor bodies of other types and materials can be used.

Figure 4A:
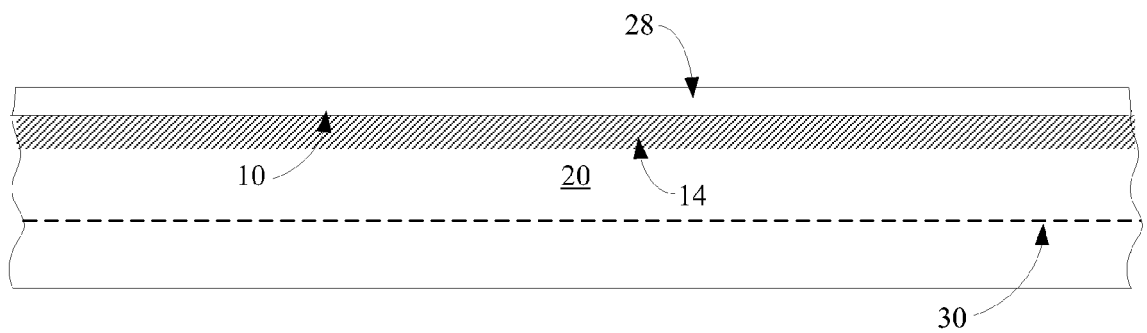
FIGS. 4a-4d are cross-sectional drawings illustrating stages in formation of a photovoltaic cell according to an embodiment of the present invention.

Referring to FIG. 4a, donor wafer 20 is a monocrystalline silicon wafer which is lightly to moderately doped to a first conductivity type. The present example will describe a relatively lightly n-doped wafer 20 but it will be understood that in this and other embodiments the dopant types can be reversed. Wafer 20 may be doped to a concentration of between about $1\times10^{15}$ and about $1\times10^{18}$ dopant atoms/cm$^3$, for example about $1\times10^{17}$ dopant atoms/cm$^3$. Donor wafer 20 may be, for example, solar- or semiconductor-grade silicon.

First surface 10 of donor wafer 20 may be substantially planar, or may have some preexisting texture. If desired, some texturing or roughening of first surface 10 may be performed, for example by wet etch or plasma treatment. Surface roughness may be random or may be periodic, as described in "Niggeman et al., "Trapping Light in Organic Plastic Solar Cells with Integrated Diffraction Gratings," Proceedings of the 17$^{th}$ European Photovoltaic Solar Energy Conference, Munich, Germany, 2001. Methods to create surface roughness are described in further detail in Petti, U.S. patent application Ser. No. 12/130,241, "Asymmetric Surface Texturing For Use in a Photovoltaic Cell and Method of Making," filed May 30, 2008; and in Herner, U.S. patent application Ser. No. 12/343,420, "Method to Texture a Lamina Surface Within a Photovoltaic Cell," filed Dec. 23, 2008, both owned by the assignee of the present application and both hereby incorporated by reference.

First surface 10 may be heavily doped to some depth to the same conductivity type as wafer 20, forming heavily doped region 14; in this example, heavily doped region 14 is n-type. As wafer 20 has not yet been affixed to a receiver element, high temperatures can readily be tolerated at this stage of fabrication, and this doping step can be performed by any conventional method, including diffusion doping. Any conventional n-type dopant may be used, such as phosphorus or arsenic. Dopant concentration may be as desired, for example at least $1\times10^{18}$ dopant atoms/cm$^3$, for example between about $1\times10^{18}$ and $1\times10^{21}$ dopant atoms/cm$^3$. Doping and texturing can be performed in any order, but since most texturing methods remove some thickness of silicon, it may be preferred to form heavily doped n-type region 14 following texturing.

Next, in the present embodiment, a dielectric layer 28 is formed on first surface 10. As will be seen, in the present example first surface 10 will be the back of the completed photovoltaic cell, and a conductive material is to be formed on the dielectric layer. The reflectivity of the conductive layer to be formed is enhanced if dielectric layer 28 is relatively thick. For example, if dielectric layer 28 is silicon dioxide, it may be between about 1000 and about 1500 angstroms thick, while if dielectric layer 28 is silicon nitride, it may be between about 700 and about 800 angstroms thick, for example about 750 angstroms. This layer may be grown or deposited by any suitable method. A grown oxide or nitride layer 28 passivates first surface 10 better than if this layer is deposited. In some embodiments, a first thickness of dielectric layer 28 may be grown, while the rest is deposited.

In the next step, ions, preferably hydrogen or a combination of hydrogen and helium, are implanted through dielectric layer 28 into wafer 20 to define cleave plane 30, as described earlier. The cost of this hydrogen or helium implant may reduced by methods described in Parrill et al., U.S. patent application Ser. No. 12/122,108, "Ion Implanter for Photovoltaic Cell Fabrication," filed May 16, 2008; or those of Ryding et al., U.S. patent application Ser. No. 12/494,268, "Ion Implantation Apparatus and a Method for Fluid Cooling," filed Jun. 30, 2009, both owned by the assignee of the present invention and hereby incorporated by reference. The overall depth of cleave plane 30 is determined by several factors, including implant energy. The depth of cleave plane 30 can be between about 0.2 and about 100 microns from first surface 10, for example between about 0.5 and about 20 or about 50 microns, for example between about 1 and about 10 microns or between about 1 or 2 microns and about 5 or 6 microns.

Figure 4B:
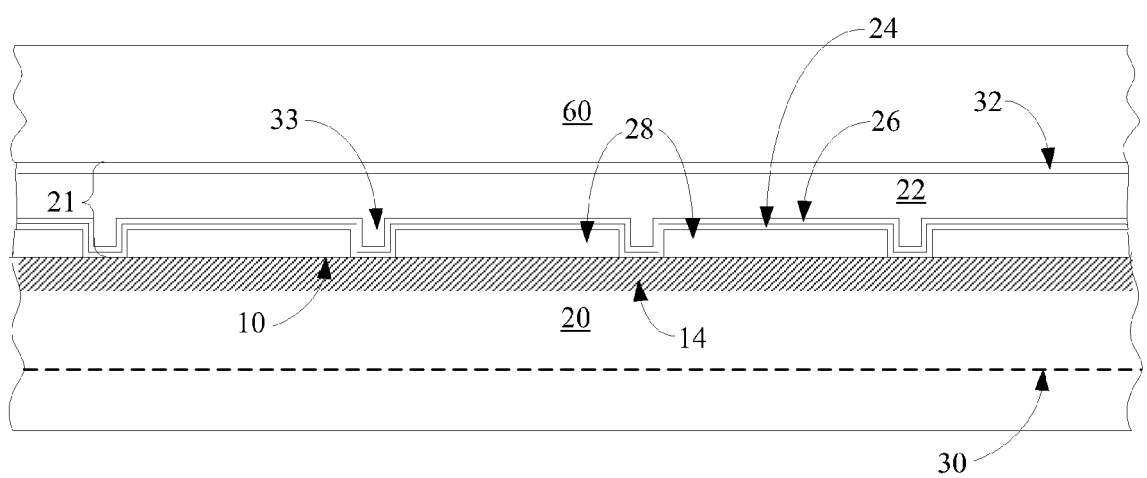

Turning to FIG. 4b, after implant, openings 33 are formed in dielectric layer 28 by any appropriate method, for example by laser scribing or screen printing. The size of openings 33 may be as desired, and will vary with dopant concentration, metal used for contacts, etc. In one embodiment, these openings may be about 40 microns square. Note that figures are not to scale.

A titanium layer 24 is formed on dielectric layer 28 by any suitable method, for example by sputtering or thermal evaporation. This layer may have any desired thickness, for example between about 20 and about 2000 angstroms, in some embodiments about 300 angstroms thick or less, for example about 100 angstroms. Layer 24 may be titanium or an alloy thereof, for example, an alloy which is at least 90 atomic percent titanium. Titanium layer 24 is in immediate contact with first surface 10 of donor wafer 20 in vias 33; elsewhere it contacts dielectric layer 28. In alternative embodiments, dielectric layer 28 is omitted, and titanium layer 24 is formed in immediate contact with donor wafer 20 at all points of first surface 10.

Non-reactive barrier layer 26 is formed on and in immediate contact with titanium layer 24. This layer is formed by any suitable method, for example by sputtering or thermal evaporation. Non-reactive barrier layer 26 may be any material, or stack of materials, that will not react with silicon, is conductive, and will provide an effective barrier to the low-resistance layer to be formed in a later step. Suitable materials for non-reactive barrier layer include TiW, TiN, W, Ta, TaN, TaSiN, Ni, Mo, Zr, or alloys thereof. The thickness of non-reactive barrier layer 26 may range from, for example, between about 100 and about 10,000 angstroms. In some embodiments this layer is about 1000 angstroms thick.

Low-resistance layer 22 is formed on non-reactive barrier layer 26. This layer may be, for example, silver, cobalt, or tungsten or alloys thereof. In this example low-resistance layer 22 is silver or an alloy that is at least 90 atomic percent silver, formed by any suitable method. Silver layer 22 may be between about 5000 and about 100,000 angstroms thick, for example about 20,000 angstroms (2 microns) thick.

In this example an adhesion layer 32 is formed on low-resistance layer 22. Adhesion layer 32 is a material that will adhere to receiver element 60, for example titanium or an alloy of titanium, for example an alloy which is at least 90 atomic percent titanium. In alternative embodiments, adhesion layer 32 can be a suitable dielectric material, such as Kapton or some other polyimide. In some embodiments, adhesion layer 32 is between about 100 and about 5000 angstroms, for example about 400 angstroms.

In alternative embodiments, some of the layers making up intermetal stack 21, such as adhesion layer 32 and low-resistance layer 22, could be deposited on receiver element 60 instead of on donor wafer 20.

Next, wafer 20 is affixed to a receiver element 60, with dielectric layer 28, titanium layer 24, non-reactive barrier layer 26, low-resistance layer 22, and adhesion layer 32 intervening. Receiver element 60 may be any suitable material, including glass, such as soda-lime glass or borosilicate glass; a metal or metal alloy such as stainless steel or aluminum; a polymer; or a semiconductor, such as metallurgical grade silicon. The wafer 20, receiver element 60, and intervening layers are bonded by any suitable method, for example by anodic bonding. In some embodiments, receiver element 60 has a widest dimension no more than about twenty percent greater than the widest dimension of wafer 20, and in most embodiments the widest dimension may be about the same as that of wafer 20. In other embodiments, receiver element 60 is significantly larger than wafer 20, and additional donor wafers may be bonded to the same receiver element.

Figure 4C:
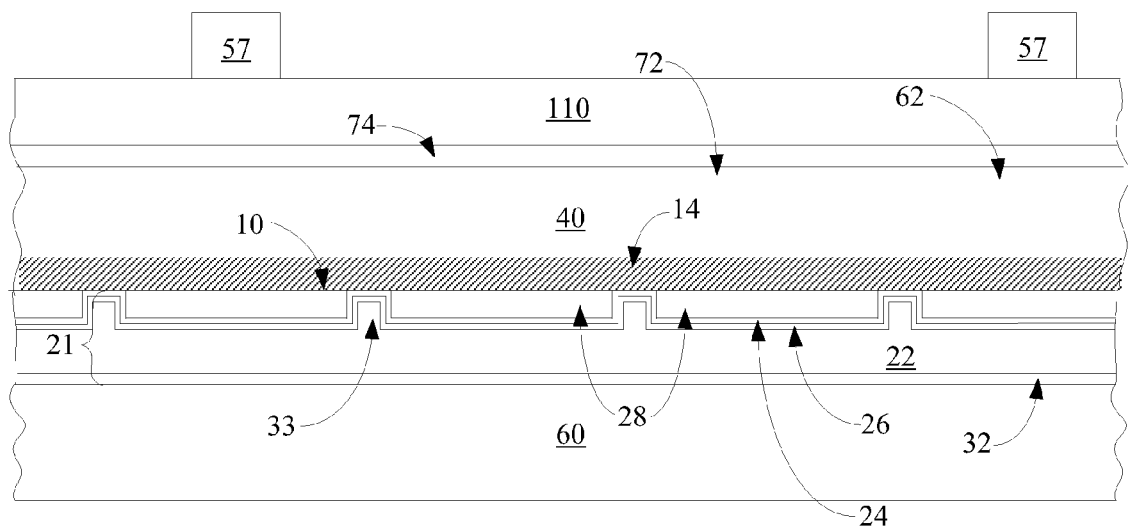

Referring to FIG. 4c, which shows the structure inverted with receiver element 60 on the bottom, a thermal step causes lamina 40 to cleave from donor wafer 20 at the cleave plane. In some embodiments, this cleaving step may be combined with a bonding step. Cleaving is achieved in this example by exfoliation, which may be achieved at temperatures between, for example, about 350 and about 650 degrees C. In general, exfoliation proceeds more rapidly at higher temperature. Keeping exfoliation temperatures below 600 degrees C., for example between about 450 and 550 degrees C., may reduce unwanted dopant diffusion. The thickness of lamina 40 is determined by the depth of cleave plane 30. In many embodiments, the thickness of lamina 40 is between about 1 and about 10 microns, for example between about 2 and about 5 microns. Bonding and exfoliation may be achieved using methods described in Agarwal et al., U.S. patent application Ser. No. 12/335,479, "Methods of Transferring a Lamina to a Receiver Element," filed Dec. 15, 2008, owned by the assignee of the present application and hereby incorporated by reference.

Second surface 62 has been created by exfoliation. Second surface 62 will typically have some damage, and steps may be taken to remove or repair this damage. Some damage may be removed by etching, for example with KOH or TMAH. An etch step intended to create some texture at this surface to increase internal reflection may be combined with the damage-removal etch, or may be performed independently.

In some embodiments, an anneal may be performed, for example following the damage-removal etch, to repair implant damage within the body of lamina 40. Annealing may be performed, for example, at 500 degrees C. or greater, for example at 550, 600, 650, 700 degrees C. or greater. In one example, the structure is annealed at about 650 degrees C. for about 45 minutes. In other embodiments, no damage anneal is performed.

During high-temperature steps, such as the damage anneal and the exfoliation of lamina 40, the portions of titanium layer 24 in immediate contact with silicon lamina 40 will react to form titanium silicide. If dielectric layer 28 was included, titanium silicide is formed where first surface 10 of lamina 40 was exposed in vias 33. If dielectric layer 28 was omitted, in general all of the titanium of titanium layer 24 will be consumed, forming a blanket of titanium silicide.

Still referring to FIG. 4c, if an anneal was performed, an oxide may form on second surface 62 which may be removed by any conventional cleaning step, for example an HF dip. After cleaning, a silicon layer is deposited on second surface 62. This layer 74 includes doped silicon, and may be amorphous, microcrystalline, nanocrystalline, or polycrystalline silicon, or a stack including any combination of these. This layer or stack may have a thickness, for example, between about 100 and about 350 angstroms. FIG. 4c shows an embodiment that includes intrinsic amorphous silicon layer 72 between second surface 62 and doped layer 74. In other embodiments, layer 72 may be omitted. In this example, heavily doped silicon layer 74 is doped p-type, opposite the conductivity type of lightly doped n-type lamina 40, and serves as the emitter of the photovoltaic cell being formed, while lightly doped n-type lamina 40 comprises the base region.

A transparent conductive oxide (TCO) layer 110 is formed on heavily doped silicon layer 74. Appropriate materials for TCO 110 include indium tin oxide, as well as aluminum-doped zinc oxide, tin oxide, titanium oxide, etc.; this layer may be, for example, about 1000 angstroms thick, and serves as both a top electrode and an antireflective layer. In alternative embodiments, an additional antireflective layer (not shown) may be formed on top of TCO 110.

A photovoltaic cell has been formed, including lightly doped n-type lamina 40, which comprises the base of the cell, and heavily doped p-type microcrystalline silicon layer 74, which serves as the emitter of the cell. Heavily doped n-type region 14 will improve electrical contact to the cell. Electrical contact must be made to both faces of the cell. This contact can be formed using a variety of methods, including those described in Petti et al., U.S. patent application Ser. No. 12/331,376, "Front Connected Photovoltaic Assembly and Associated Methods," filed Dec. 9, 2008; and Petti et al., U.S. patent application Ser. No. 12/407,064, "Method to Make Electrical Contact to a Bonded Face of a Photovoltaic Cell," filed Mar. 19, 2009, hereinafter the '064 application, both owned by the assignee of the present application and both hereby incorporated by reference. If the methods of the '064 application are employed, for example, gridlines 57 (formed by any suitable method) make electrical contact to heavily doped p-type microcrystalline silicon layer 74 by way of TCO 110, while contact is made to the base of the cell by way of heavily doped n-type layer 14.

Figure 4D:
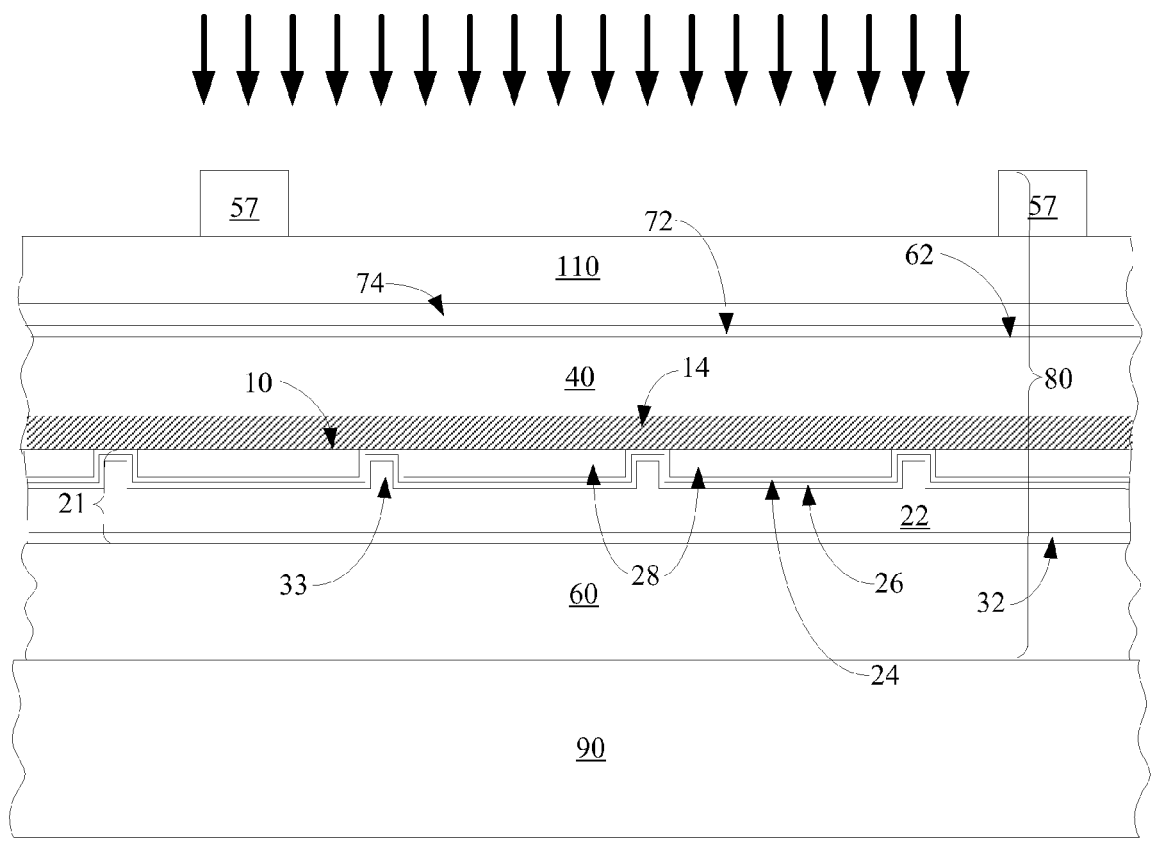

FIG. 4d shows completed photovoltaic assembly 80, which includes a photovoltaic cell and receiver element 60. The cell includes a base, which is the lightly doped n-type body of lamina 40, and the emitter, heavily doped p-type microcrystalline silicon layer 74. Heavily doped n-type region 14 provides electrical contact to the base. In alternative embodiments, by changing the dopants used, heavily doped region 14 may serve as the emitter, at first surface 10, while heavily doped silicon layer 74 serves as a contact to the base region. Incident light (indicated by arrows) falls on TCO 110, enters the cell at heavily doped p-type microcrystalline silicon layer 74, enters lamina 40 at second surface 62, and travels through lamina 40. In this embodiment, receiver element 60 serves as a substrate. If receiver element 60 has, for example, a widest dimension about the same as that of lamina 40, the receiver element 60 and lamina 40, and associated layers, form a photovoltaic assembly 80. Multiple photovoltaic assemblies 80 can be formed and affixed to a supporting substrate 90 or, alternatively, a supporting superstrate (not shown).

In other embodiments, a plurality of donor wafers may be affixed to a single receiver element, yielding multiple laminae, which are fabricated into photovoltaic cells as described. The photovoltaic cells may be electrically connected in series, forming a photovoltaic module.

To summarize, what has been described is a photovoltaic assembly comprising: a semiconductor lamina; a contact layer of titanium silicide, or including regions of titanium silicide, wherein the titanium silicide of the contact layer is in immediate contact with the semiconductor lamina; a non-reactive barrier layer in immediate contact with the contact layer; a low-resistance layer, the non-reactive barrier layer disposed between the low-resistance layer and the contact layer, the low-resistance layer comprising silver, cobalt, or tungsten or alloys thereof; a receiver element; an adhesion layer, the adhesion layer in immediate contact with the receiver element and disposed between the receiver element and the low-resistance layer; and a photovoltaic cell, wherein the photovoltaic cell comprises the lamina.

A variety of embodiments has been provided for clarity and completeness. Clearly it is impractical to list all possible embodiments. Other embodiments of the invention will be apparent to one of ordinary skill in the art when informed by the present specification. Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A photovoltaic assembly comprising:
    a silicon lamina;
    a receiver element;
    a low-resistance layer disposed between the lamina and the receiver element, wherein the low-resistance layer is silver, cobalt, tungsten, or an alloy thereof;
    a contact layer disposed between the low-resistance layer and the lamina, wherein the contact layer is substantially titanium in unreacted regions and substantially titanium silicide in reacted regions wherein the reacted regions of the contact layer are in immediate contact with the lamina;
    a dielectric material intervening between the lamina and the unreacted regions of the contact layer;
    a non-reactive barrier layer disposed between the low-resistance layer and the contact layer; and
    a photovoltaic cell, wherein the photovoltaic cell comprises the lamina.

2. The photovoltaic assembly of claim 1 wherein the non-reactive barrier layer is TiW, TiN, W, Ta, TaN, TaSiN, Ni, Mo, Zr, or an alloy thereof.

3. The photovoltaic assembly of claim 1 wherein the lamina has a thickness between 1 and 20 microns.

4. The photovoltaic assembly of claim 1 further comprising an adhesion layer disposed between the low-resistance layer and the receiver element, wherein the adhesion layer is titanium or an alloy thereof.

5. The photovoltaic assembly of claim 4 wherein the adhesion layer is in immediate contact with the receiver element.

6. The photovoltaic assembly of claim 1 wherein the low-resistance layer is silver or an alloy of silver which is at least 90 atomic percent silver.

7. The photovoltaic assembly of claim 1 wherein the receiver element comprises glass.

8. The photovoltaic assembly of claim 1 wherein the contact layer is in immediate contact with the barrier layer.

9. The photovoltaic assembly of claim 8 wherein the contact layer is 300 angstroms thick or less.

10. The photovoltaic assembly of claim 1 wherein the barrier layer is in immediate contact with the low-resistance layer.

11. The photovoltaic assembly of claim 1 wherein the unreacted regions of the contact layer are titanium or an alloy of titanium which is at least 90 atomic percent titanium, and wherein the reacted regions of the contact layer are titanium silicide or a silicide of an alloy of titanium which is at least 90 atomic percent titanium.

12. The photovoltaic assembly of claim 1 wherein the non-reactive barrier layer is conductive.

13. A photovoltaic assembly comprising:
- a semiconductor lamina;
- a dielectric material;
- a contact layer including regions of titanium silicide and regions of substantially titanium, wherein the titanium silicide of the contact layer is in immediate contact with the semiconductor lamina and wherein the regions of substantially titanium are in immediate contact with the dielectric material;
- a non-reactive barrier layer in immediate contact with the contact layer;
- a low-resistance layer, the non-reactive barrier layer disposed between the low-resistance layer and the contact layer, the low-resistance layer comprising silver, cobalt, or tungsten or alloys thereof;
- a receiver element;
- an adhesion layer, the adhesion layer in immediate contact with the receiver element and disposed between the receiver element and the low-resistance layer; and
- a photovoltaic cell, wherein the photovoltaic cell comprises the lamina.

14. The photovoltaic structure of claim 13 wherein the lamina is between 1 microns and 10 microns thick.

15. The photovoltaic structure of claim 14 wherein the lamina is between 2 microns and 5 microns thick.

16. The photovoltaic assembly of claim 13 wherein the non-reactive barrier layer is TiW, TiN, W, Ta, TaN, TaSiN, Ni, Mo, Zr, or an alloy thereof.

17. The photovoltaic assembly of claim 13 wherein the adhesion layer is titanium or an alloy thereof.

18. The photovoltaic assembly of claim 13 wherein the low-resistance layer is silver or an alloy of silver which is at least 90 atomic percent silver.

19. The photovoltaic assembly of claim 13 wherein the receiver element comprises glass.

20. The photovoltaic assembly of claim 13 wherein the silicon lamina is monocrystalline silicon.

* * * * *